(12) United States Patent
Kim et al.

(10) Patent No.: US 12,044,706 B2
(45) Date of Patent: Jul. 23, 2024

(54) NOISE EFFECT REDUCED-TYPE ROGOWSKI SENSOR, MANUFACTURING METHOD THEREOF, AND SIGNAL PROCESSING CIRCUIT THEREFOR

(71) Applicant: HYUNDAI MOBIS Co., Ltd., Seoul (KR)

(72) Inventors: Sang Min Kim, Yongin-si (KR); Won Gon Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 100 days.

(21) Appl. No.: 17/852,837

(22) Filed: Jun. 29, 2022

(65) Prior Publication Data

US 2023/0042621 A1 Feb. 9, 2023

(30) Foreign Application Priority Data

Aug. 6, 2021 (KR) .................. 10-2021-0103815

(51) Int. Cl.
*G01R 15/18* (2006.01)
(52) U.S. Cl.
CPC .................. *G01R 15/181* (2013.01)
(58) Field of Classification Search
CPC ...... G01R 1/20; G01R 15/146; G01R 15/181; G01R 19/0053; G01R 3/00; H01F 27/28; H01F 27/29; H01F 38/28
USPC ..................... 324/127, 117 R, 126
See application file for complete search history.

(56) References Cited

U.S. PATENT DOCUMENTS

| | | | | |
|---|---|---|---|---|
| 6,624,624 B1 * | 9/2003 | Karrer | .................. | G01R 15/181 324/117 R |
| 11,366,141 B1 * | 6/2022 | Daubert | ................. | G01R 19/14 |
| 2008/0106254 A1 * | 5/2008 | Kojovic | ............... | G01R 15/181 336/200 |
| 2016/0055963 A1 * | 2/2016 | Lockstedt | ............... | H01F 27/30 336/105 |

FOREIGN PATENT DOCUMENTS

| | | | |
|---|---|---|---|
| CN | 113804955 A | * | 12/2021 |
| KR | 10-1136181 B1 | | 4/2012 |
| WO | WO-2020017276 A1 | * | 1/2020 |

\* cited by examiner

*Primary Examiner* — Tung X Nguyen
*Assistant Examiner* — Robert P Alejnikov, Jr.
(74) *Attorney, Agent, or Firm* — Morgan, Lewis & Bockius LLP

(57) ABSTRACT

An invention that reduces an influence of dv/dt noise generated by power switching elements around a Rogowski current sensor. By separating a coil into two coils and connecting voltages generated from the two coils in series in a reverse direction, a total amount of parasitic capacitance is reduced by ¼, and accordingly, Cp*dv/dt noise is reduced. The Rogowski sensor including a first coil (Coil-P) which detects a portion of a switching current passing through bus bars (20a, 20b) and includes a first end and a second end, and a second coil (Coil-N), as a coil separated from the first coil, which detects a portion of the switching current passing through the bus bar and includes a first end and a second end, wherein the second end of the first coil is connected to the second end of the second coil to form a neutral point (123).

13 Claims, 15 Drawing Sheets

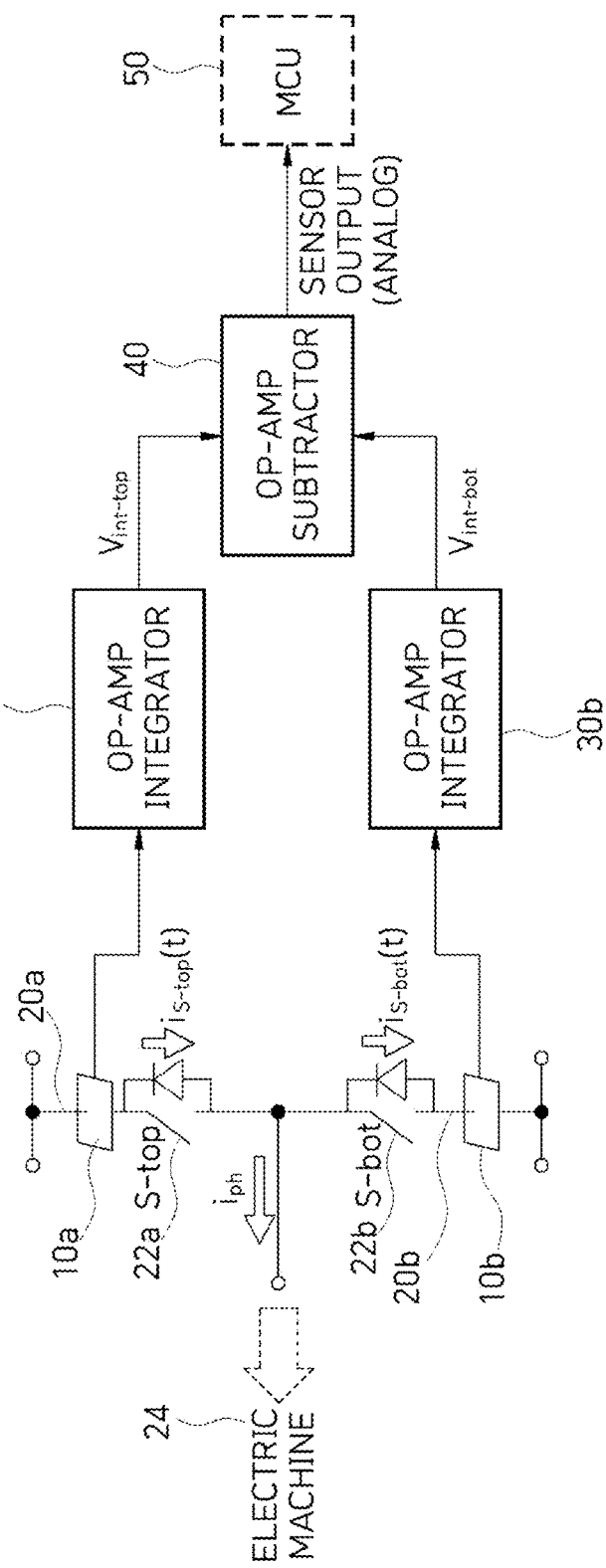

$L_S$: SELF-INDUCTANCE OF SECONDARY WINDING
M: MUTUAL INDUCTANCE
$C_S$: WINDING CAPACITANCE OF MULTI-LAYER COIL
$R_S$: SERIES RESISTANCE OF SECONDARY WINDING
$C_P$: PARASITIC COUPLING CAPACITANCE

NOISE EFFECT REDUCED-TYPE ROGOWSKI SENSOR, MANUFACTURING METHOD THEREOF, AND SIGNAL PROCESSING CIRCUIT THEREFOR

CROSS-REFERENCE TO RELATED APPLICATION

This application claims priority to and the benefit of Korean Patent Application No. 10-2021-0103815, filed on Aug. 6, 2021, the disclosure of which is incorporated herein by reference in its entirety.

BACKGROUND

1. Field of the Invention

The present invention relates to a technique for reducing an influence of noise on Rogowski sensors for detecting switching currents of power semiconductors (e.g., metal oxide semiconductor field effect transistors (MOSFETs), insulated gate bipolar transistors (IGBTs), and the like) used in a motor drive inverter, a direct current (DC)-DC converter, and the like.

2. Discussion of Related Art

In order to detect or measure switching currents of power semiconductors (e.g., metal oxide semiconductor field effect transistors (MOSFETs), insulated gate bipolar transistors (IGBTs), and the like) used in a motor drive inverter, a direct current (DC)-DC converter, and the like, in the related art, magnetic sensors (e.g., Hall sensors) using magnet cores are used. However, in the case of these magnetic sensors, a problem of magnetic flux saturation due to a core occurs, and when detecting a high current, a size of the Hall sensor should be quite larger, and thus a price rises.

To overcome the above problems, a switching current sensing method using a Rogowski current sensor and an operational amplifier (OP-amp) has been developed. Since this method does not use a core, there is no problem of magnetic flux saturation, and thus even when detecting a large current, it is advantageous in terms of size and price when compared with the existing Hall sensor method.

FIGS. 1A to 1D are diagrams for describing a switching current sensing method using a Rogowski sensor, an OP-amp integrator, and a subtractor which are currently used.

FIG. 1A is a schematic circuit diagram illustrating an example in which a Rogowski sensor is used to detect a switching current of a three-phase inverter and that shows only one-phase leg among three phases. Rogowski sensors 10a and 10b are applied to a high-side bus bar 20a and a low-side bus bar 20b of the one-phase leg of the three-phase inverter. Switching elements 22a and 22b are inserted in the middle of the high-side bus bar 20a and the low-side bus bar 20b to perform current switching, and a current $i_{ph}$ of a corresponding phase is supplied to an electric machine 24 such as an external motor or the like. Current signals detected by the Rogowski sensors 10a and 10b, which are applied to the bus bars 20a and 20b, are transmitted to OP-amp integrators 30a and 30b, respectively. The integrators 30a and 30b integrate the current signals from the Rogowski sensors 10a and 10b and output voltages $v_{int\text{-}top}$ and $v_{int\text{-}bot}$ proportional to switching currents is-top and is-bot which are switched by the switching elements 22a and 22b, respectively. The output voltages $v_{int\text{-}top}$ and $v_{int\text{-}bot}$ of the integrators 30a and 30b are subtracted by an OP-amp subtractor 40 and then restored to phase currents by a main control unit (MCU) 50.

The Rogowski sensor is actually manufactured in the form of a printed circuit board (PCB). FIG. 1B is a conceptual plan view illustrating a Rogowski sensor PCB 60 implemented in the form of a PCB, and FIG. 1C is a conceptual cross-sectional view illustrating a layered structure of the Rogowski sensor PCB 60. The Rogowski sensor PCB 60 is manufactured in an annular shape (or a quadrangular shape) with an empty space in a central portion. The central empty space is a space through which the bus bars 20a and 20b pass. A conductor pattern 12 is disposed to vertically pass through each layer inside the Rogowski sensor PCB 60 having a four-layer structure including layers of GND1, VCC1, VCC2, and GND2 from top to bottom, and two terminals of $V_{coil1}$ and $V_{coil2}$ are manufactured to be drawn out.

However, the Rogowski sensor is affected by dv/dt noise due to switching of the power switching elements 22a and 22b in the vicinity thereof such that an output signal is distorted. As in FIG. 1D (a noise modeling circuit), the dv/dt noise is applied as switching noise $$dv/dt = C_p \frac{dv_{sw}}{dt}$$

through a parasitic coupling capacitance $C_p$ and appears at the output terminals $V_{coil1}$ and $V_{coil2}$ of the Rogowski sensor. Here, $V_{sw}$ means a voltage of the power switching element. In addition, a noise current value flowing from the parasitic coupling capacitance $C_p$ to the terminal $V_{coil1}$ becomes $$i_{noise} = \frac{\frac{1}{2}C_p C_s}{\frac{1}{2}C_p + C_s} \frac{dv_{sw}}{dt},$$

and when $C_p = C_s$, the noise current value becomes $$i_{noise} = \frac{1}{3} C_p \frac{dv_{sw}}{dt}.$$

For reference, in FIG. 1D, Ls means self-inductance of a secondary winding, M means mutual inductance, $C_s$ means winding capacitance of a multi-layer coil, $R_s$ means series resistance of the secondary winding, and $C_p$ means parasitic coupling capacitance.

In order to reduce the influence of the switching noise, a method of adding a shield layer to the PCB is possible. However, in this case, since a PCB requires at least six layers, cost is significantly increased.

SUMMARY OF THE INVENTION

The present invention is directed to reducing an influence of dv/dt noise generated by power switching elements around a Rogowski current sensor.

In order to achieve the above task, a coil formed on the existing circular or quadrangular printed circuit board (PCB) is divided into two PCBs, and a coil pattern is configured for each PCB. By connecting voltages generated from the two coils in series in a reverse direction, a total amount of parasitic capacitance is reduced by ¼, and accordingly, Cp*dv/dt noise is reduced.

According to one aspect of the present invention, there is provided a Rogowski sensor for detecting a switching current passing through a bus bar into which a switching element is inserted, the Rogowski sensor including a first coil which detects a first portion of the switching current passing through the bus bar and includes a first end and a second end, and a second coil, as a coil separated from the first coil, which detects a second portion of the switching current passing through the bus bar and includes a first end and a second end, wherein the second end of the first coil is connected to the second end of the second coil to form a neutral point.

According to another aspect of the present invention, there is provided a method of manufacturing a Rogowski sensor, the method including manufacturing printed circuit boards (PCBs) with a bus bar, into which a switching element is inserted, interposed therebetween, wherein the PCB is manufactured so that the switching element is located around the bus bar, and the PCB has a four-layer structure including layers of GND1, VCC1, VCC2, and GND2, arranging the first coil inside the PCB so that a first conductor pattern vertically passes through each layer and exposing the first end and the second end of the first coil to an outside of the PCB, arranging the second coil inside the PCB so that a second conductor pattern separated from the first conductor pattern vertically passes through each layer and exposing the first end and the second end of the second coil to the outside of the PCB, and connecting the second end of the first coil to the second end of the second coil to form a neutral point.

According to still another aspect of the present invention, there is provided a circuit for processing an output signal of the Rogowski sensor, the circuit including a first damping resistor connected to the first end and the second end of the first coil, a second damping resistor connected to the first end and the second end of the second coil, a first input resistor, a second input resistor, and an integrator including a negative (−) input to which the first end of the first coil is connected through the first input resistor and a positive (+) input to which the first end of the second coil is connected through the second input resistor.

A configuration and an operation of the present invention will become more apparent from embodiments described in detail below with reference to the accompanying drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIGS. 1A to 1D are diagrams for describing a switching current sensing method using a Rogowski sensor, an OP-amp integrator, and a subtractor according to the related art;

DETAILED DESCRIPTION OF EXEMPLARY EMBODIMENTS

Advantages and features of the present invention and methods for achieving them will be made clear from exemplary embodiments described in detail below with reference to the accompanying drawings. However, the present invention is not limited to the embodiments described below and may be implemented in various other forms. The embodiments are provided such that this disclosure will be thorough and complete and will fully convey the scope of the present invention to those skilled in the art to which the present invention pertains, and the present invention is defined by only the scope of the appended claims. In addition, terms used herein are for the purpose of describing the embodiments and are not intended to limit the present invention. In this disclosure, the singular forms include the plural forms unless the context clearly dictates otherwise. The term "comprise" or "comprising" used herein does not preclude the presence or addition of one or more other elements, steps, operations, and/or devices other than stated elements, steps, operations, and/or devices.

Hereinafter, exemplary embodiments of the present invention will be described in detail with reference to the accompanying drawings. In describing the embodiments, when a detailed description of related known configurations or functions is determined to obscure the gist of the present invention, the detailed description thereof will be omitted.

Figure 2A:
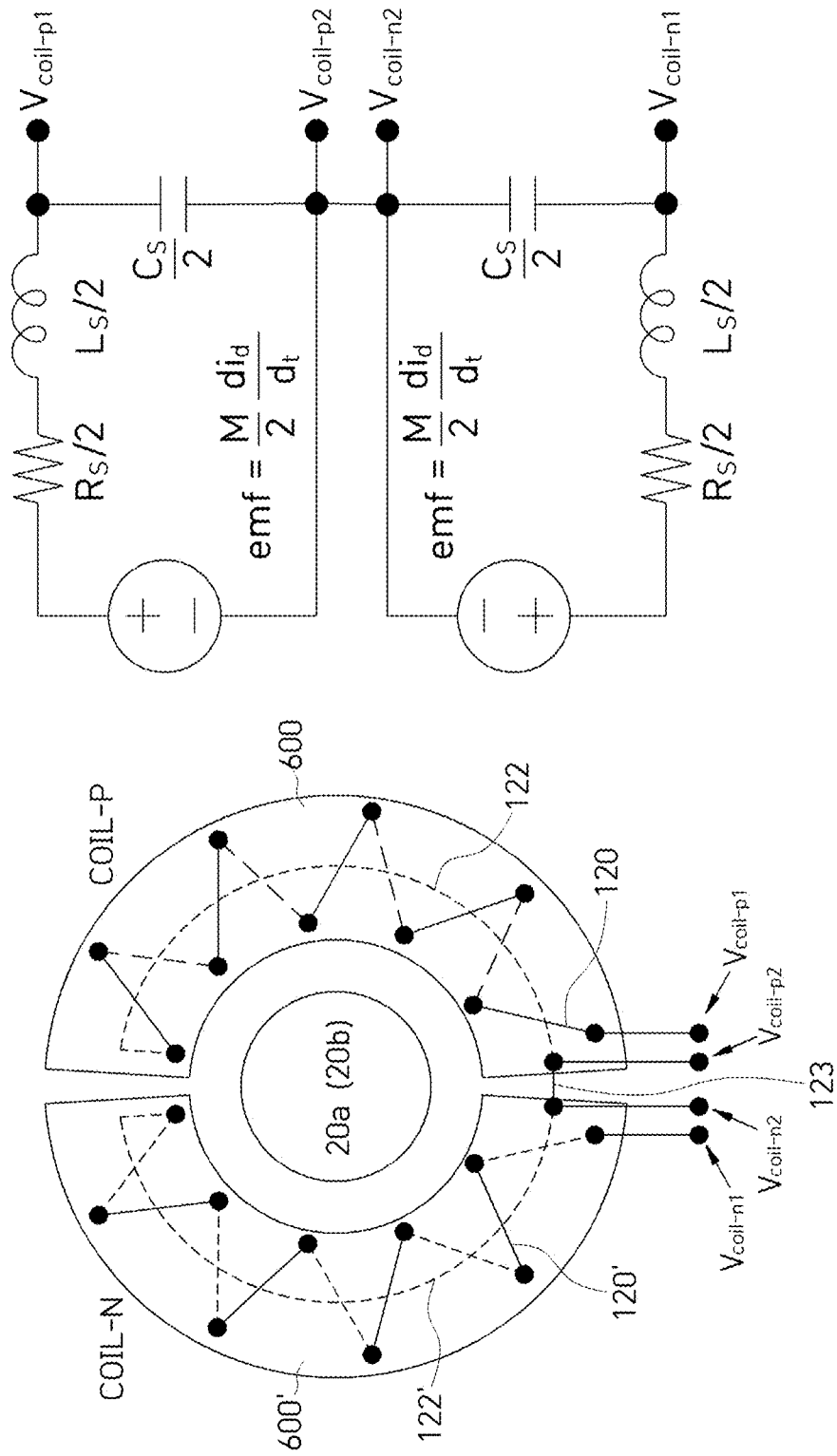
FIG. 2A is a diagram illustrating a configuration and an equivalent modeling circuit of the Rogowski sensor according to the present invention.

FIG. 2A is a diagram illustrating a configuration and an equivalent modeling circuit of the Rogowski sensor according to an embodiment of the present invention.

As shown, the Rogowski sensor is basically manufactured by separating a single coil, which is formed as a pattern on the existing circular or quadrangular PCB, into two coils and the two coils are formed by forming each pattern. To this end, the PCB is divided into a first PCB 600 and a second PCB 600' having semicircular or "⊏" shapes, and conductor patterns 120 and 120' are formed for each of the PCBs 600 and 600' to form coils. As described above, the separately manufactured Rogowski coils are referred to a Coil-P and a Coil-N. Two outputs are drawn out from each coil. That is, $V_{coil-p1}$ and $V_{coil-p2}$, and $V_{coil-n1}$ and $V_{coil-n2}$ are drawn from the Coil-P and the Coil-N. Among the output terminals of the two coils, return lines 122 and 122' are connected to each other to form a neutral point. Here, a neutral point 123 is formed by connecting $V_{coil-p2}$ to $V_{coil-n2}$.

Figure 2B:
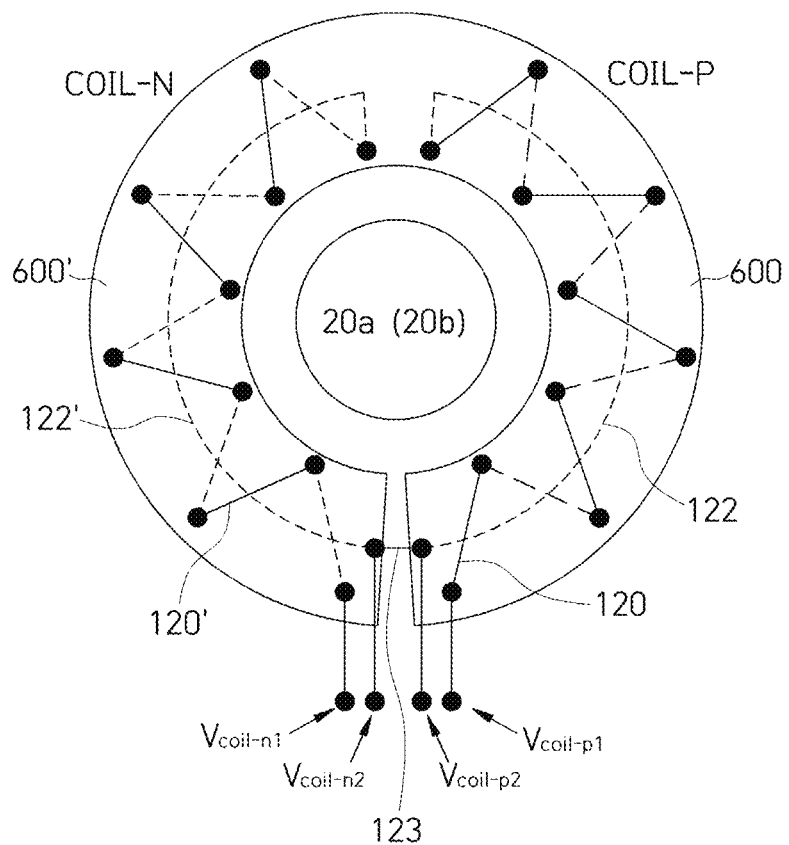
FIG. 2B is a diagram illustrating a configuration of another form of the Rogowski sensor shown in FIG. 2A.

FIG. 2B is a diagram illustrating a configuration of another form of the Rogowski sensor shown in FIG. 2A. In the configuration shown in FIG. 2A, the PCB is divided into the first PCB 600 and the second PCB 600' having semicircular or "⊏" shapes, and the conductor patterns 120 and 120' are formed for each of the PCBs 600 and 600' to divide the coil. However, in the configuration of FIG. 2B, only the coil is separated without separating the PCB. Accordingly, the object of the present invention can be achieved while reducing the loss due to the dual manufacturing and management of the PCB.

Figure 1B:
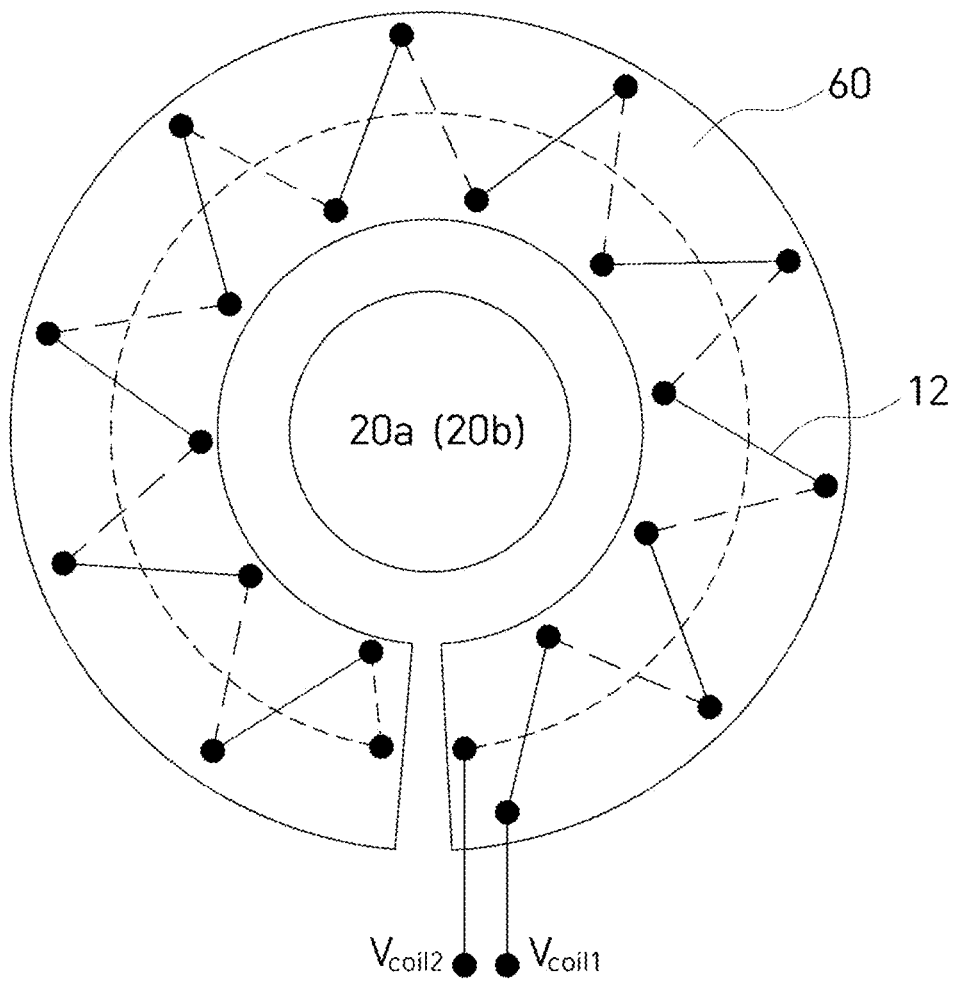
Figure 1C:
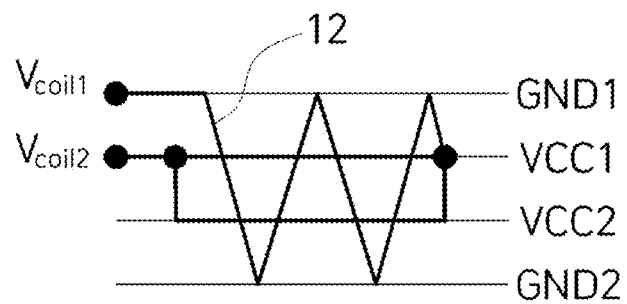
Figure 1D:
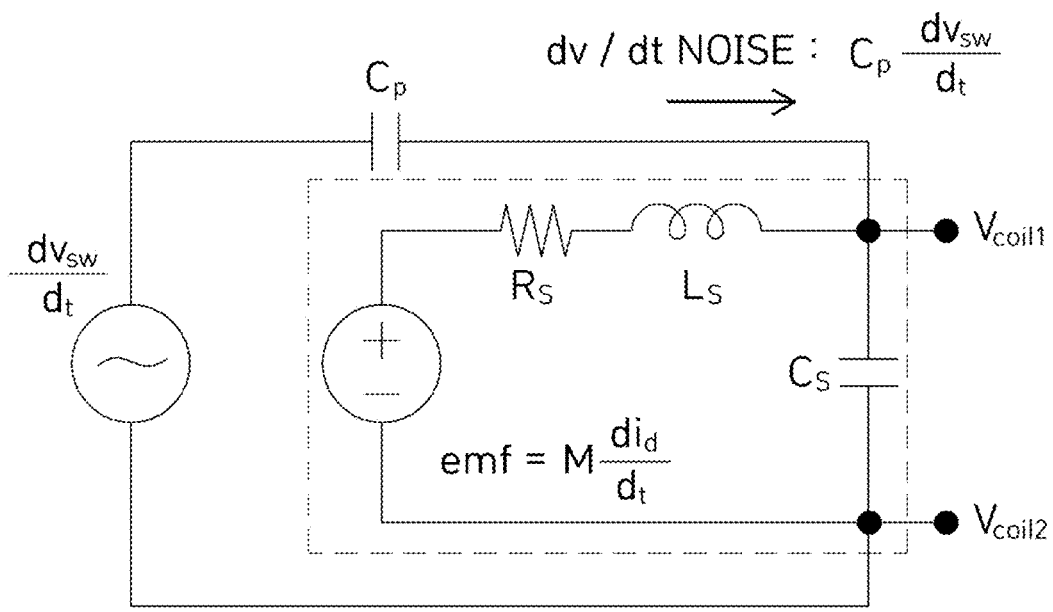

Returning to FIG. 2A, with reference to an equivalent circuit in FIG. 2A (the equivalent circuit is the same even in the case of FIG. 2B), when compared with FIG. 1D which is the equivalent circuit of the Rogowski sensor according to the related art, due to the separated Rogowski coil, R, L, and C parameter values of each coil are ½ of those of the single coil according to the related art. In particular, as the inductance and the capacitance are reduced by ½, there is an effect of increasing a sensor bandwidth (BW). That is, a sensor BW frequency of the Rogowski sensor according to the related art is $$f_{sensor,BW} = \frac{1}{2\pi\sqrt{L_s C_s}} [Hz],$$

but a sensor BW frequency of the Rogowski sensor according to the present invention is $$f_{sensor,BW} = \frac{1}{2\pi\sqrt{(L_s/2) \cdot (C_s/2)}} = \frac{1}{\pi\sqrt{L_s C_s}}.$$

Accordingly, a switching (di/dt) current may be measured faster compared to switching current sensing using the Rogowski sensor according to the related art.

Figure 2C:
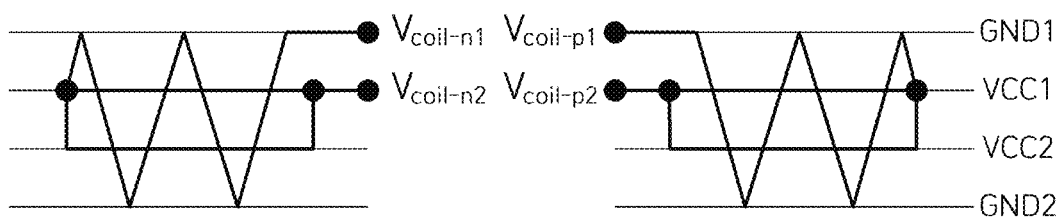
FIG. 2C is a diagram illustrating a layered structure of a Rogowski sensor PCB according to the present invention.

FIG. 2C is a diagram illustrating a layered structure of a Rogowski sensor PCB according to the present invention. The Rogowski sensor may be implemented with a four-layer PCB in the same way as the existing PCB having the same layered structure as shown in FIG. 1C.

Figure 3A:
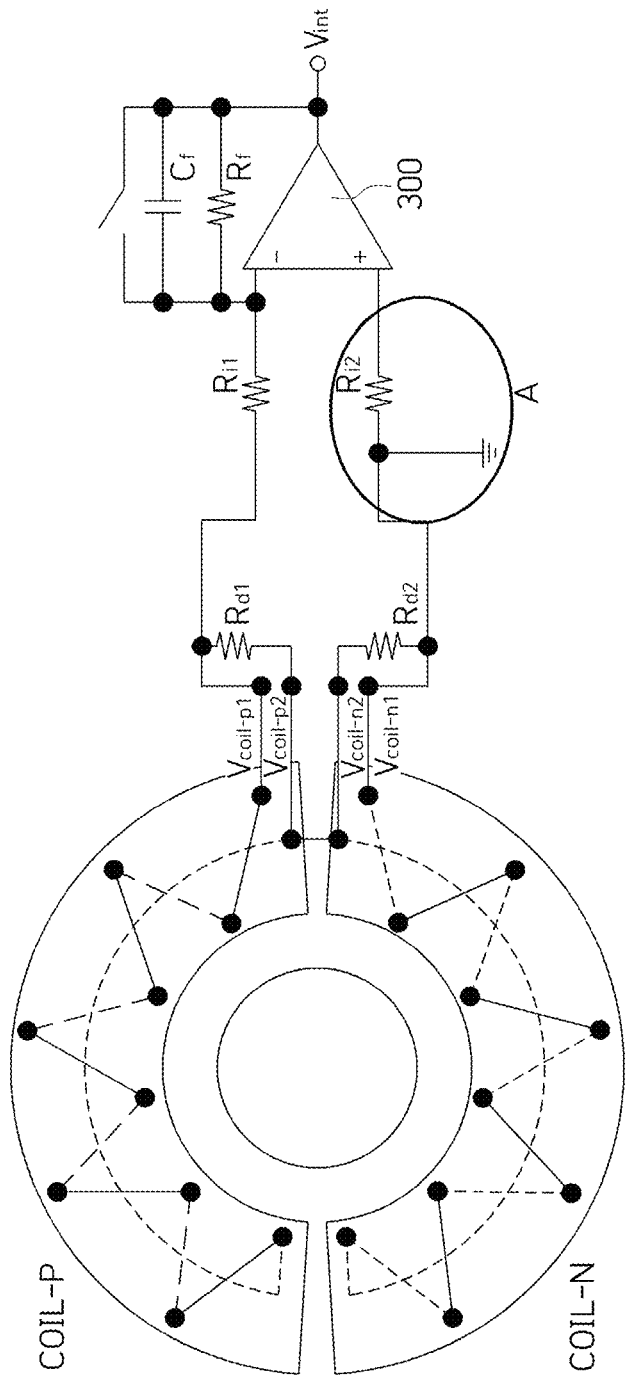
FIG. 3A is a diagram illustrating a signal processing circuit to which the Rogowski sensor according to the present invention is applied.

FIG. 3A is a diagram illustrating a signal processing circuit to which the Rogowski sensor according to the present invention is applied. Although the form in which the PCB is separated as shown in FIG. 2A is representatively illustrated, even the case in which the PCB is not separated as shown in FIG. 2B is also the same.

Damping resistors $R_{d1}$ and $R_{d2}$ are respectively connected to two ends of the output terminals of each coil, that is, $V_{coil-p1}$ and $V_{coil-p2}$, and $V_{coil-n1}$ and $V_{coil-n2}$. Then, the independent output terminals $V_{coil-p1}$ and $V_{coil-n1}$ of each coil are connected to a negative (−) input and a positive (+) input of an integrator 300 through a first input resistor and a second input resistor $R_{i2}$, respectively.

When considering a configuration of a + input part A of the integrator 300, the resistor $R_{i2}$ is connected to $V_{coil-n1}$ in series. When supply power of the integrator 300 is double power, as shown in FIG. 2A, a connection point of $V_{coil-n1}$ and resistor $R_{i2}$ is connected to GND. On the other hand, when the supply power of the integrator 300 is single power, a reference voltage of ½ of a supply voltage is generated and connected. For example, when the supply voltage is 5 V, the reference voltage is set to 2.5 V and applied to the + input part A of the integrator 300.

Figure 3B:
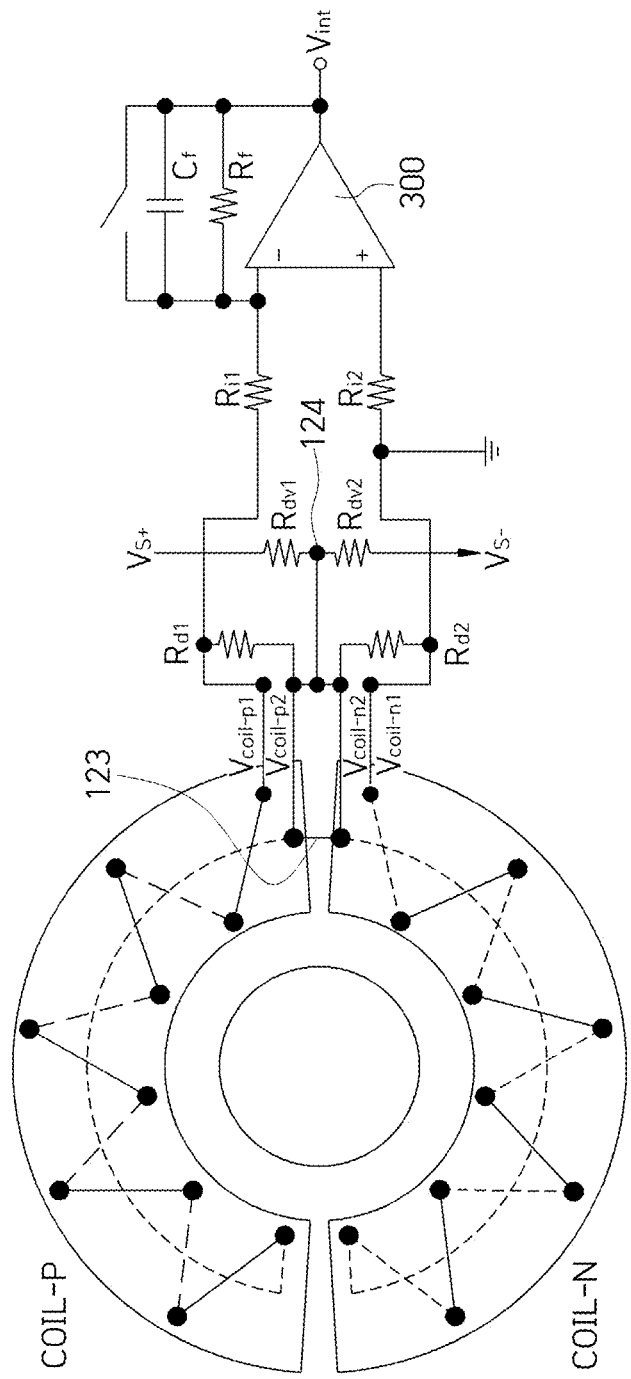
FIG. 3B is a diagram illustrating a circuit configuration of another form of an integrator in the signal processing circuit.

FIG. 3B is a diagram illustrating a circuit configuration of another form of the integrator 300 in the signal processing circuit. A virtual ground 124 is created using a voltage divider in which resistors $R_{dv1}$ and $R_{dv2}$ are connected in series between two types of power $V_{s+}$ and $V_{s-}$. The virtual ground 124 is connected to a point where the two coils meet, that is, the neutral point 123 shown in FIG. 2A. In this way, the circuit using the voltage divider resistors forms a reference potential on a path of the dv/dt noise.

Figure 4A:
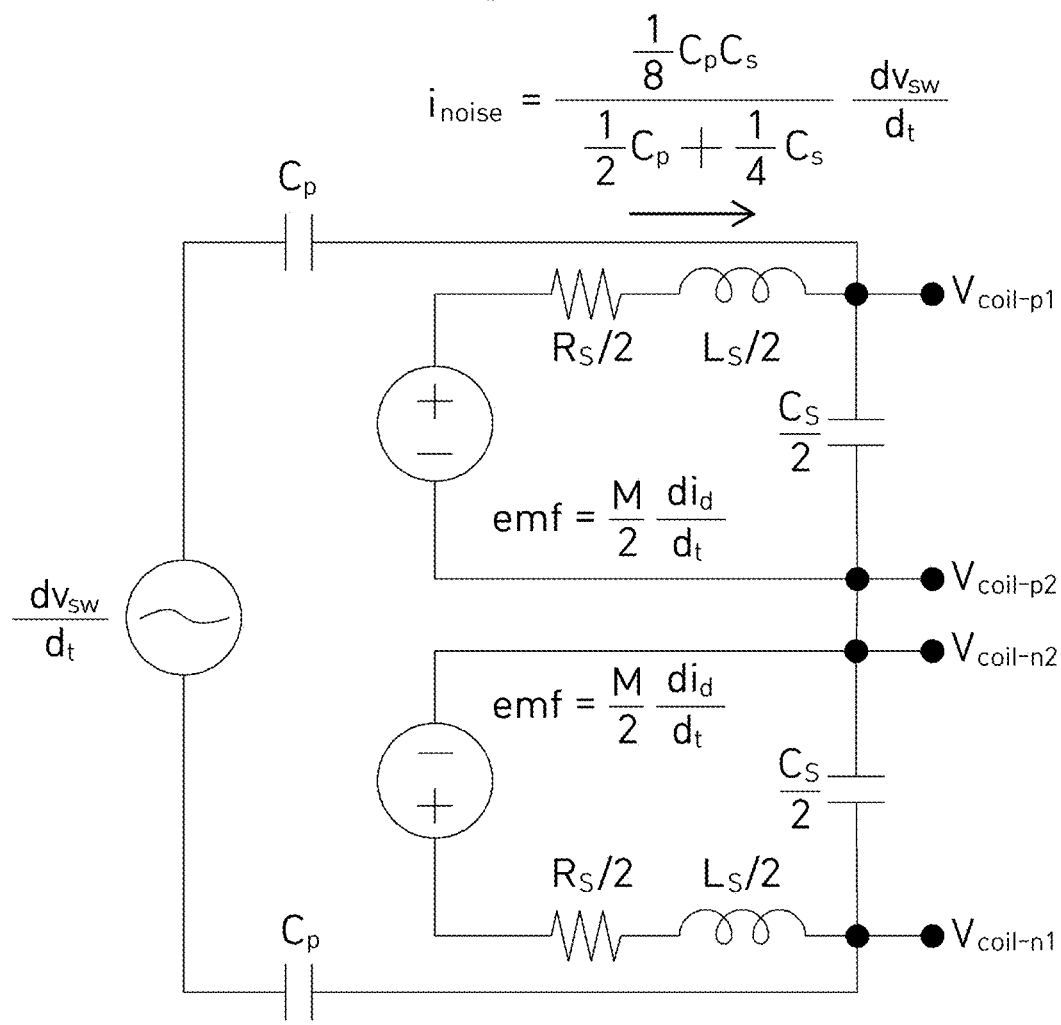
FIGS. 4A and 4B are diagrams illustrating a noise modeling circuit of a Rogowski sensor having separated coils according to the present invention.
Figure 4B:
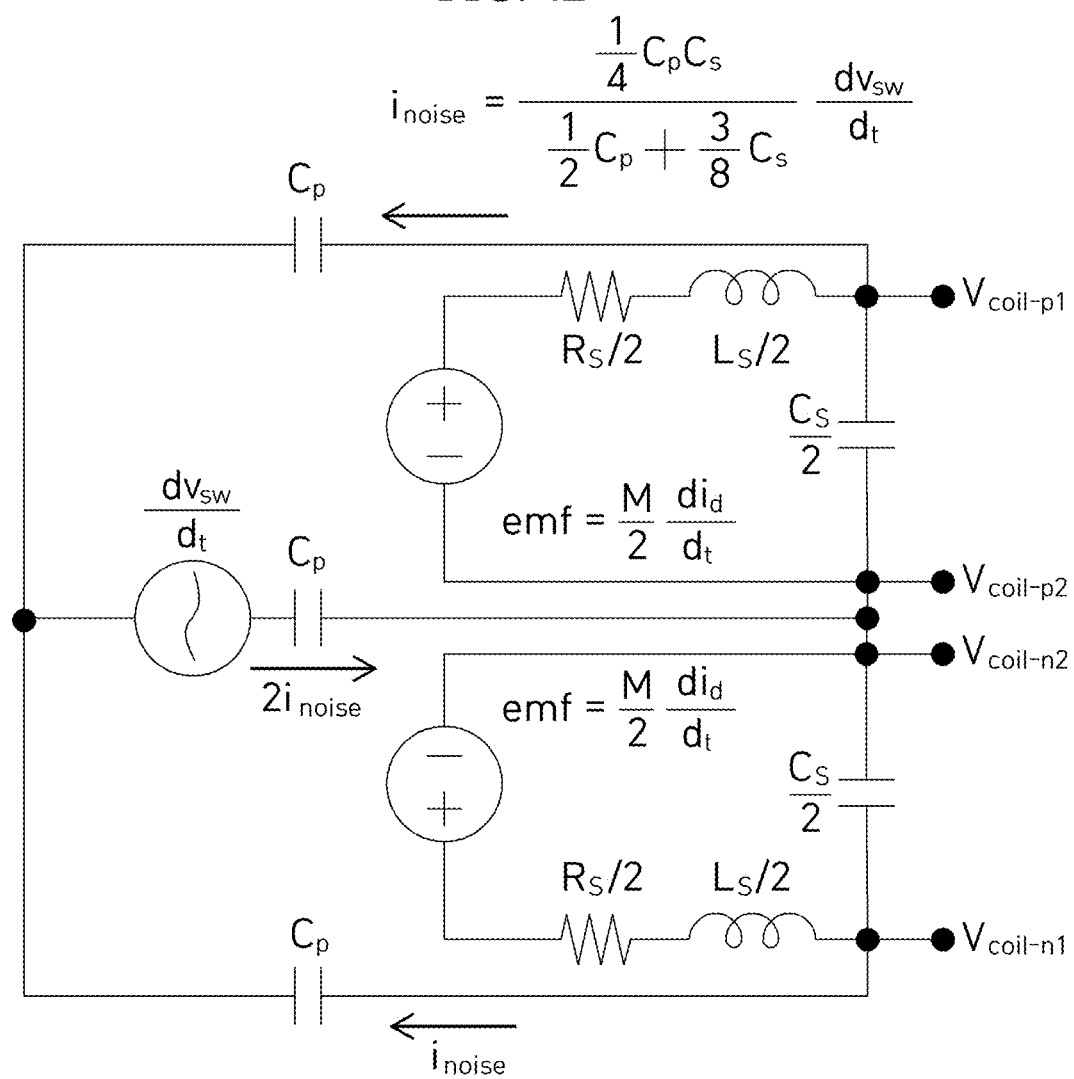

FIGS. 4A and 4B are diagrams illustrating a noise modeling circuit of a Rogowski sensor having separated coils according to the present invention, wherein FIG. 4A shows a case in which noise is introduced into an end portion of one coil of the separated coils, and FIG. 4B shows a case in which noise is introduced into the neutral point of the two separated coils. Hereinafter, a noise influence of the Rogowski sensor according to the present invention will be described. The noise influence of the Rogowski sensor according to the related art has been described with reference to FIG. 1D.

First, FIG. 4A shows a case in which the dv/dt noise is introduced into the terminal $V_{coil-p1}$ of Coil-P (or a case in which the dv/dt noise is introduced into the terminal $V_{coil-n1}$ of Coil-N), that is, shows a noise modeling circuit when a dv/dt noise current flows into an end of one coil of the Coil-P and exits through the other end of the Coil-N. In this case, the dv/dt noise current becomes $$i_{noise} = \frac{\frac{1}{8}C_p C_s}{\frac{1}{2}C_p + \frac{1}{4}C_s} \frac{dv_{sw}}{dt}.$$

However, in this case, the noise influence is varied according to a ratio of $C_p$ and $C_s$. When $C_p = C_s$, the dv/dt noise current flowing in one coil is halved. That is, the dv/dt noise current becomes $$i_{noise} = \frac{1}{6}C_p \frac{dv_{sw}}{dt}.$$

FIG. 4B shows a case in which the dv/dt noise is introduced into the neutral point 123 where Coil-P and Coil-N meet, that is, shows a noise modeling circuit when the dv/dt noise current flows into a point (neutral point) where two coils meet and then branches into Coil-P and Coil-N. In this case, the dv/dt noise current becomes $$i_{noise} = \frac{\frac{1}{4}C_p C_s}{\frac{1}{2}C_p + \frac{3}{8}C_s} \frac{dv_{sw}}{dt}.$$

However, in this case, since noise voltages introduced into Coil-P and Coil-N have the same magnitude and opposite signs, as shown in FIG. 3A, the noise voltages are offset when input to the integrator 300. Here, when $C_p = C_s$, the dv/dt noise current is reduced by 40%. That is, the dv/dt noise current becomes $$i_{noise} = \frac{1}{5}C_p \frac{dv_{sw}}{dt}.$$

The performance of the Rogowski sensor according to the present invention is verified through a simulation.

1. Case in which dv/dt noise in the form of a sinusoidal wave is introduced: In this case, $V_n = 120 \sin(2\pi f_n t)$; $f_n = 2$ MHz was applied as a sinusoidal wave.

Figure 5A:
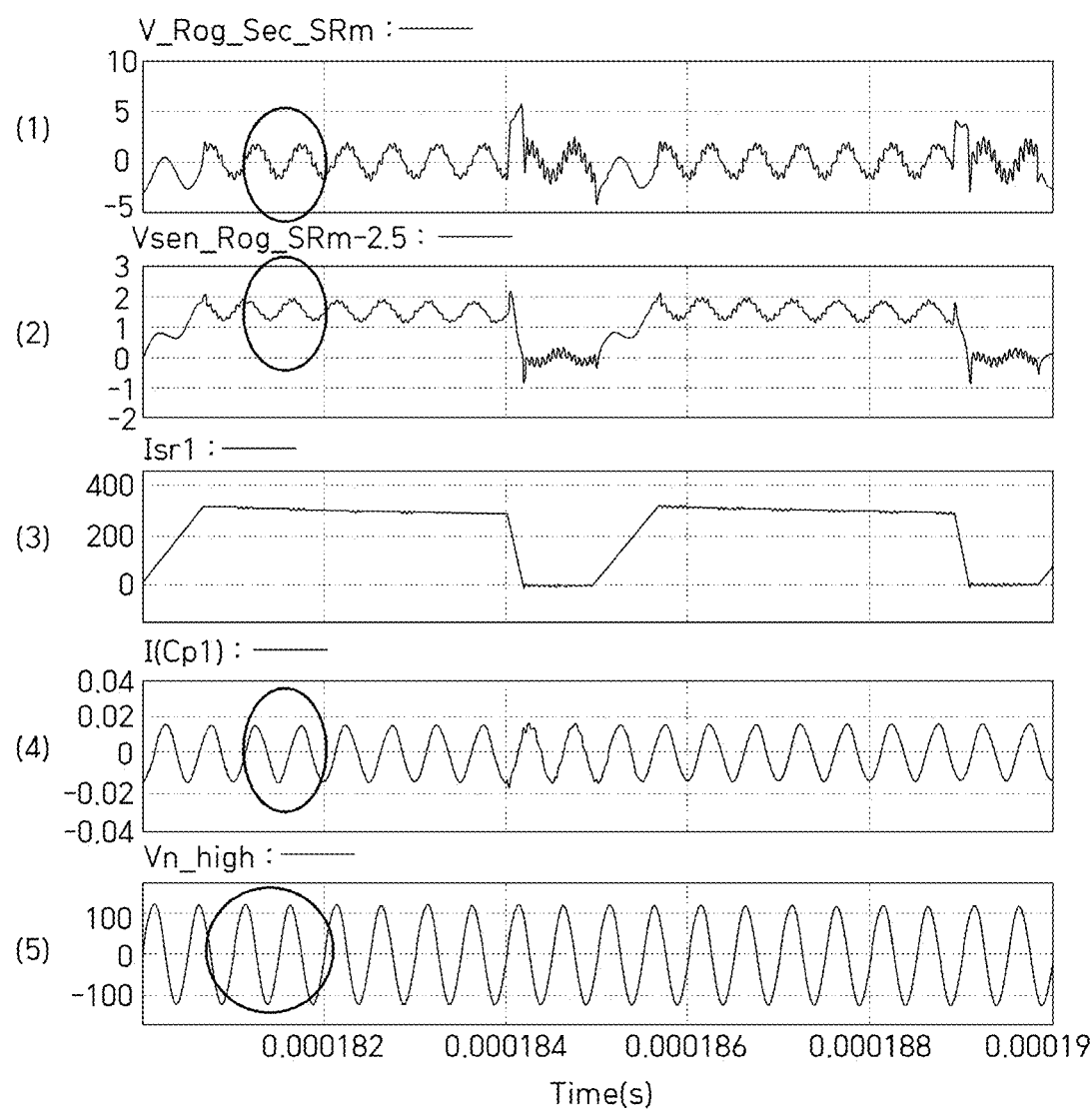
FIGS. 5A to 5C are graphs showing simulation results when sinusoidal noise is introduced.

FIG. 5A shows simulation results of the Rogowski sensor according to the related art when the sinusoidal noise is introduced. Sinusoidal wave distortion (±2V) occurred in an output signal of the coil due to noise, and accordingly, the sinusoidal wave distortion (±0.4V) also occurred in an integrator output (a sensor output). For reference, in FIG. 5A, (1) a coil output voltage is V_Rog_Sec_SRm, (2) an integrator output voltage is Vsen_Rog_SRm-2.5, (3) an actual switching current is Isr1, (4) a Cp*dv/dt noise current is I(Cp1), and (5) switching voltage noise is Vn_high.

Figure 5B:
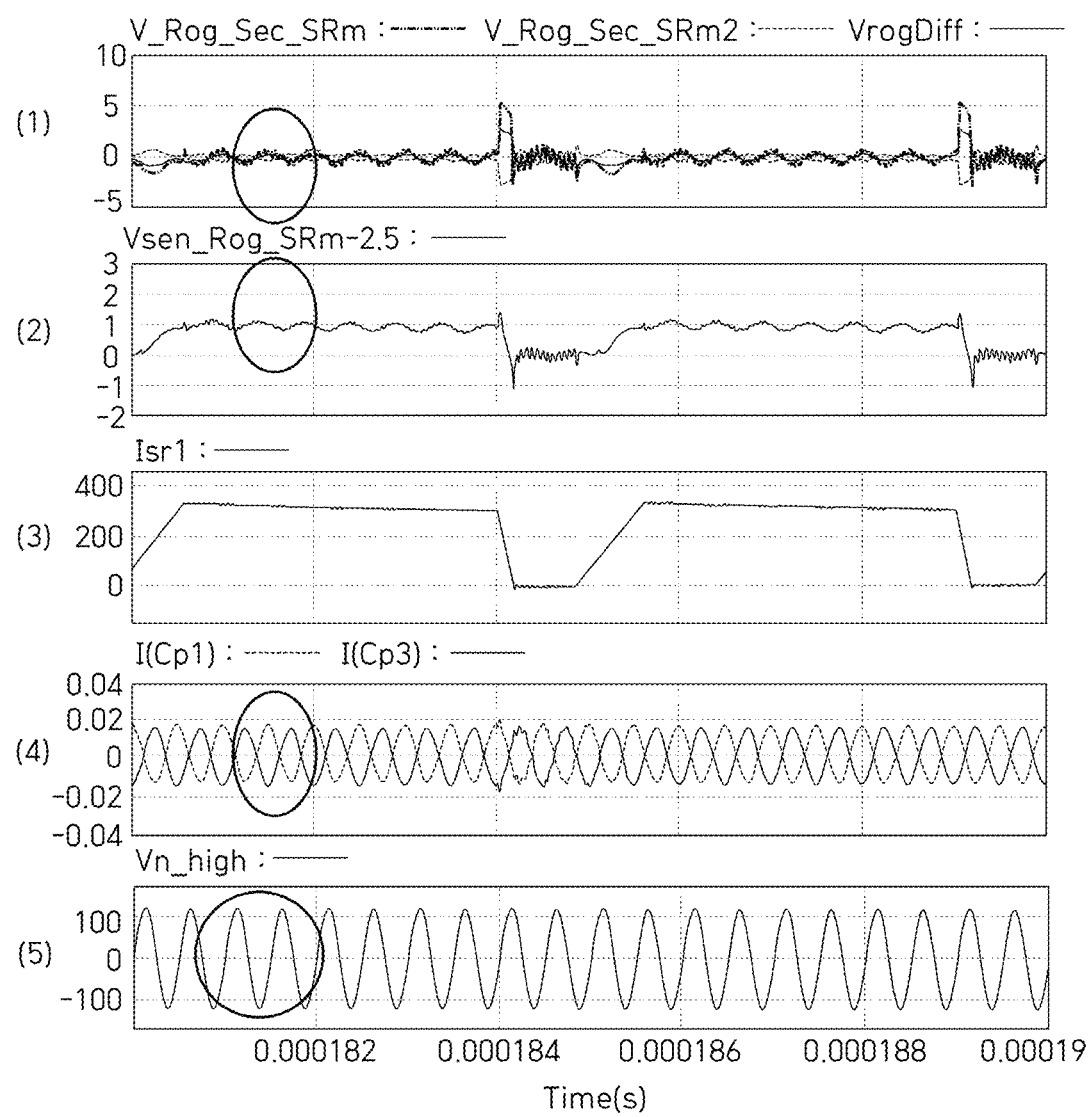

FIG. 5B shows simulation results of a case in which sinusoidal noise is introduced into one end of the coil of the Rogowski sensor of the present invention. A magnitude of the distortion of the sinusoidal wave applied to the coil output signal was reduced to ±0.8V, and accordingly, the distortion of the integrator output (the sensor output) was also reduced to ±0.16V. Here, (1) the coil output voltage V_Rog_Sec_SRm is the output of a coil 1, V_rog_Sec_SRm2 is the output of a coil 2, and VrogDiff is a difference between the coils 1 and 2 (an integrator input voltage), (2) the integrator output voltage is Vsen_Rog_SRm-2.5, (3) the actual switching current is Isr1, (4) the Cp*dv/dt Noise current I(Cp1) is the noise current flowing into the coil 1, I(Cp2) is the sum of the noise flowing into the coils 1 and 2, I(Cp3) is the noise current flowing into the coil 2, and (5) the switching voltage noise is Vn_high.

Figure 5C:
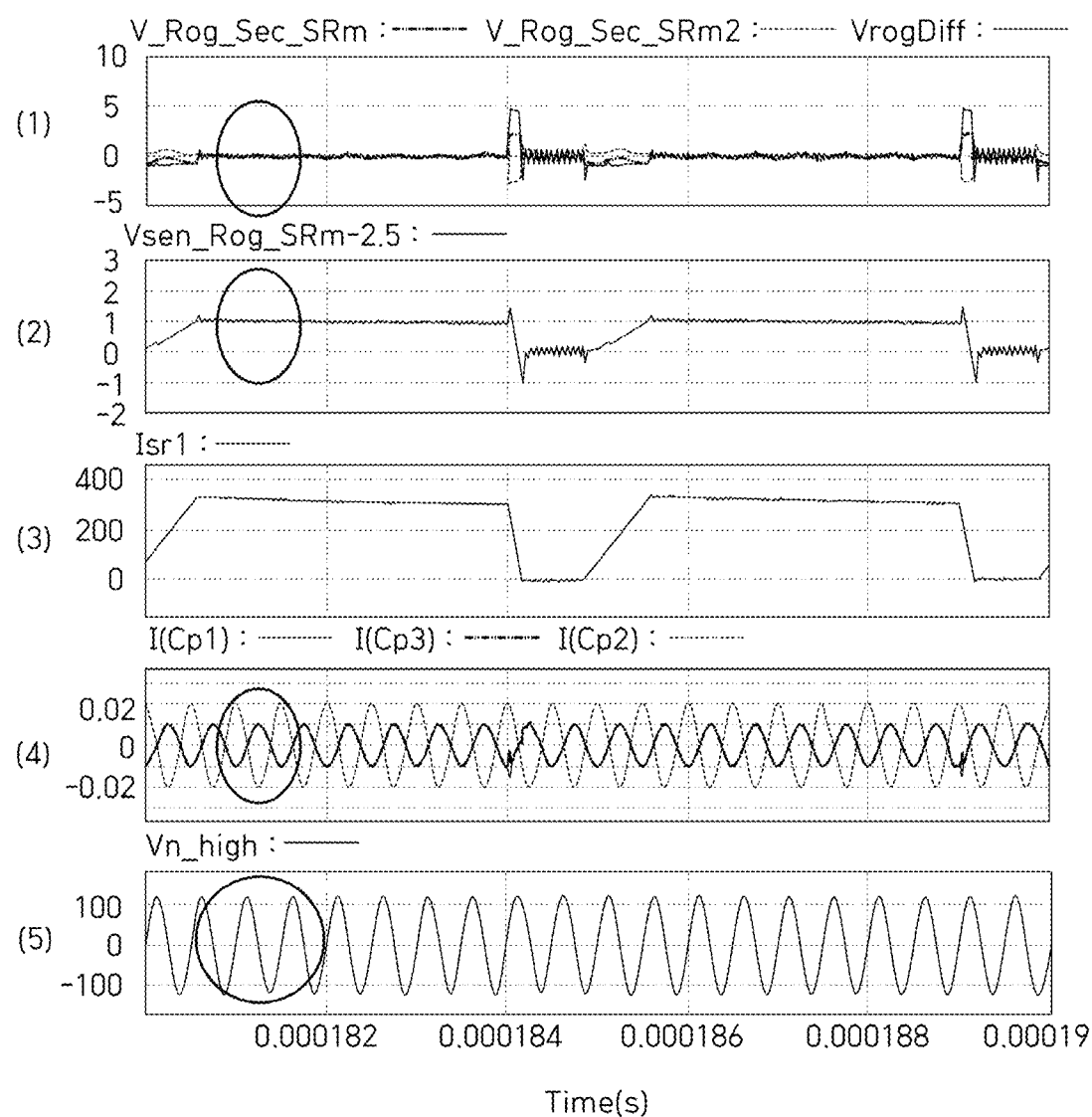

FIG. 5C shows simulation results of a case in which the sinusoidal noise is introduced into the neutral point of the Rogowski sensor of the present invention. It can be seen that the magnitude of the distortion of the sinusoidal wave applied to the coil output signal was reduced to ±0.3V, and the noise voltages induced in the output terminals of each coil were offset when input to the integrator so that the noise disappeared from the integrator output. Here, (1) the coil output voltage V_Rog_Sec_SRm is the output of a coil 1, V_rog_Sec_SRm2 is the output of a coil 2, and VrogDiff is a difference between the coils 1 and 2 (an integrator input voltage), (2) the integrator output voltage is Vsen_Rog_SRm-2.5, (3) the actual switching current is Isr1, (4) Cp*dv/dt Noise current I(Cp1) is the noise current flowing into the coil 1, I(Cp2) is the sum of the noise flowing into the coils 1 and 2, I(Cp3) is the noise current flowing into the coil 2, and (5) the switching voltage noise is Vn_high.

2. Case in which dv/dt noise in the form of a pulse is introduced: In this case, $$V_n = 240\text{V}; \frac{dv}{dt} = \frac{240\text{V}}{0.3us}$$

was applied as a pulse.

Figure 6A:
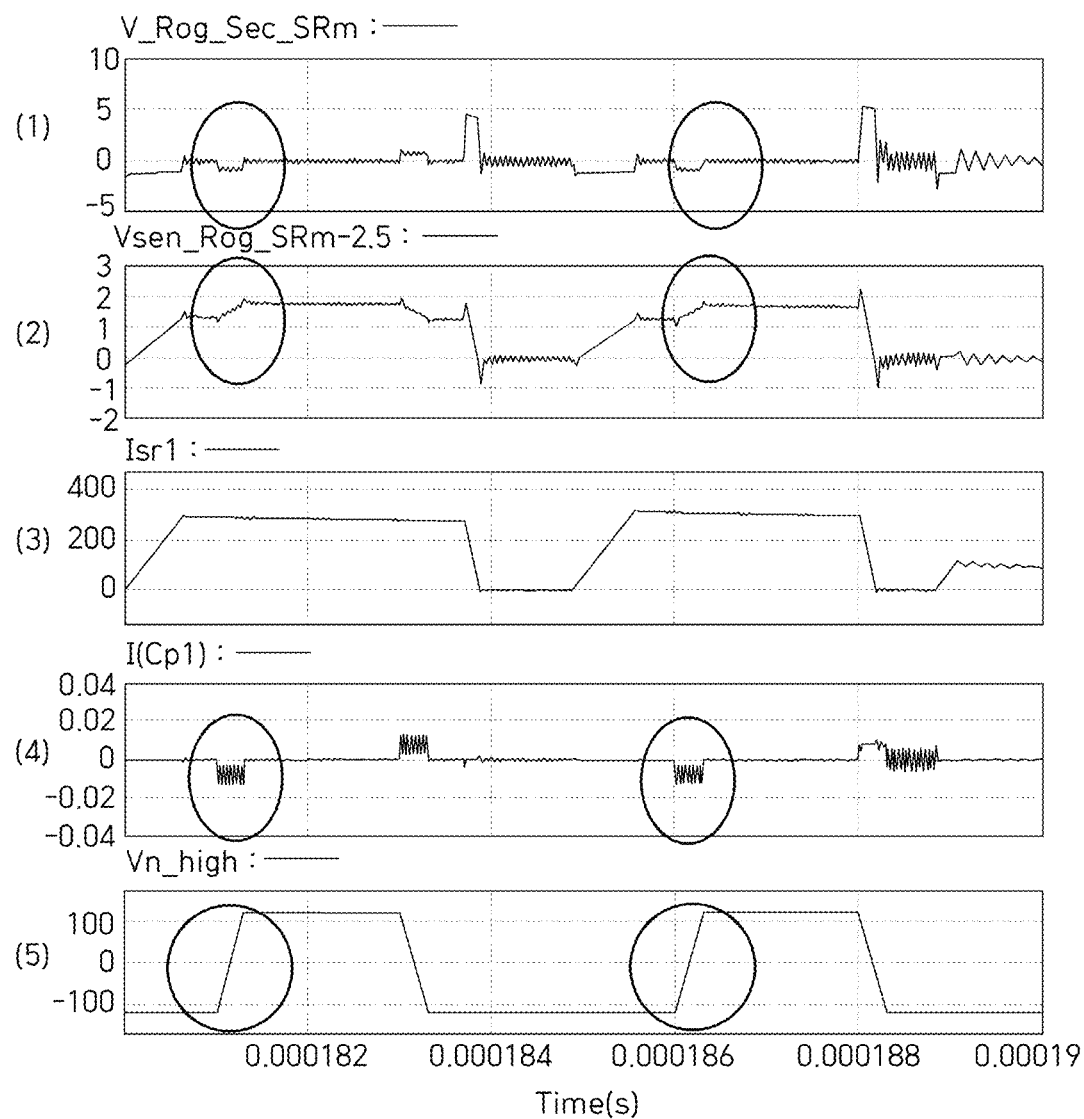
FIGS. 6A to 6C are graphs showing simulation results when pulse noise is introduced.

FIG. 6A shows simulation results of the Rogowski sensor according to the related art when the pulse noise is introduced. The coil output signal was distorted by noise (a pulse of −1 V), and as a result, a distortion of 0.5 V occurred in the integrator output (the sensor output). For reference, here, (1) a coil output voltage is V_Rog_Sec_SRm, (2) an integrator output voltage is Vsen_Rog_SRm-2.5, (3) an actual switching current is Isr1, (4) a Cp*dv/dt noise current is I(Cp1), and (5) switching voltage noise is Vn_high.

Figure 6B:
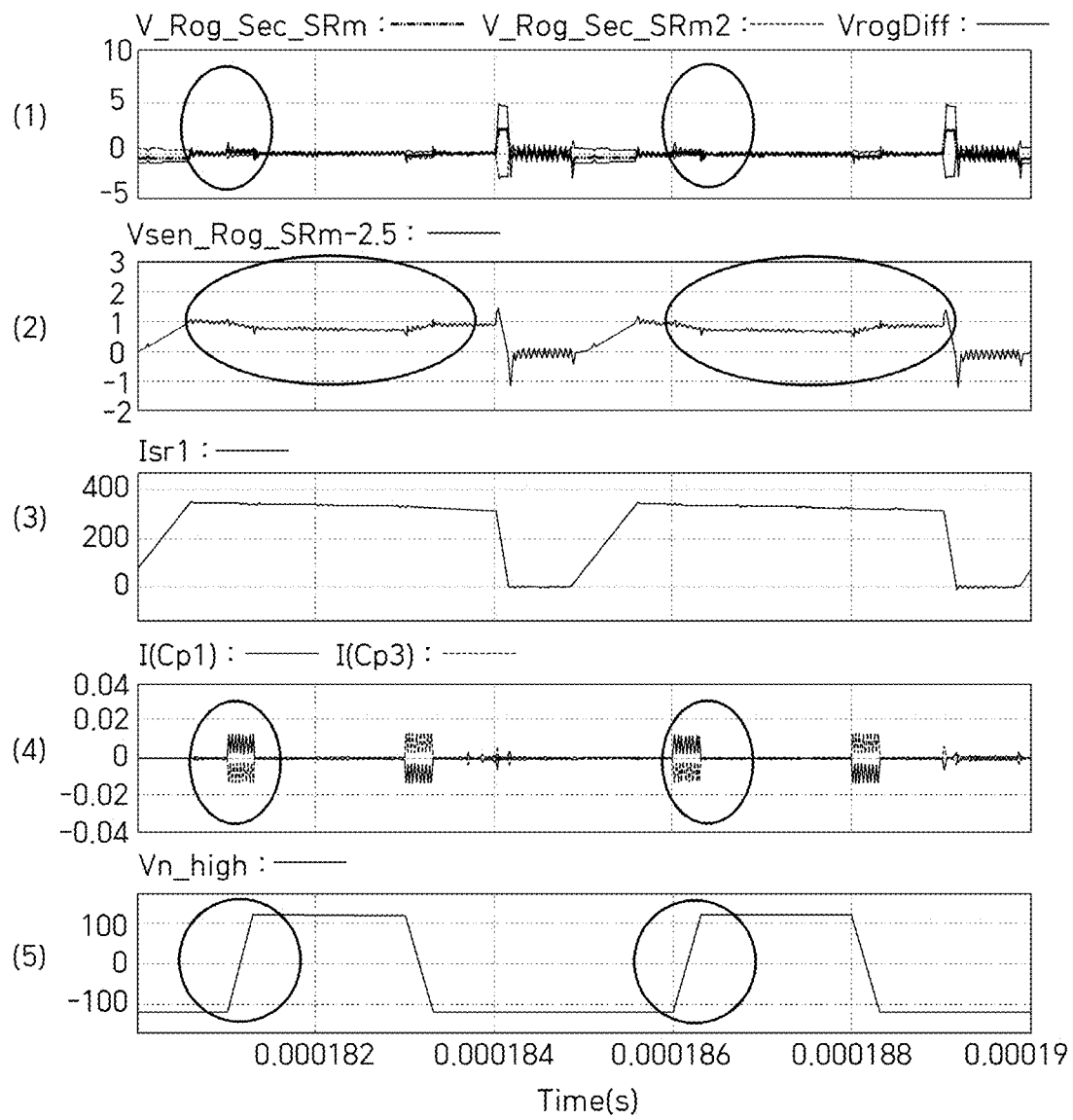

FIG. 6B shows simulation results of a case in which pulse noise is introduced into one end of the coil of the Rogowski sensor of the present invention. A magnitude of the distortion applied to the coil output signal was reduced to 0.4 V, and accordingly, the distortion of the integrator output (the sensor output) was also reduced to 0.2 V. Here, (1) the coil output voltage V_Rog_Sec_SRm is the output of a coil 1, V_rog_Sec_SRm2 is the output of a coil 2, and VrogDiff is a difference between the coils 1 and 2 (an integrator input voltage), (2) the integrator output voltage is Vsen_Rog_SRm-2.5, (3) the actual switching current is Isr1, (4) the Cp*dv/dt Noise current I(Cp1) is the noise current flowing into the coil 1, I(Cp2) is the sum of the noise flowing into the coils 1 and 2, I(Cp3) is the noise current flowing into the coil 2, and (5) the switching voltage noise is Vn_high.

Figure 6C:
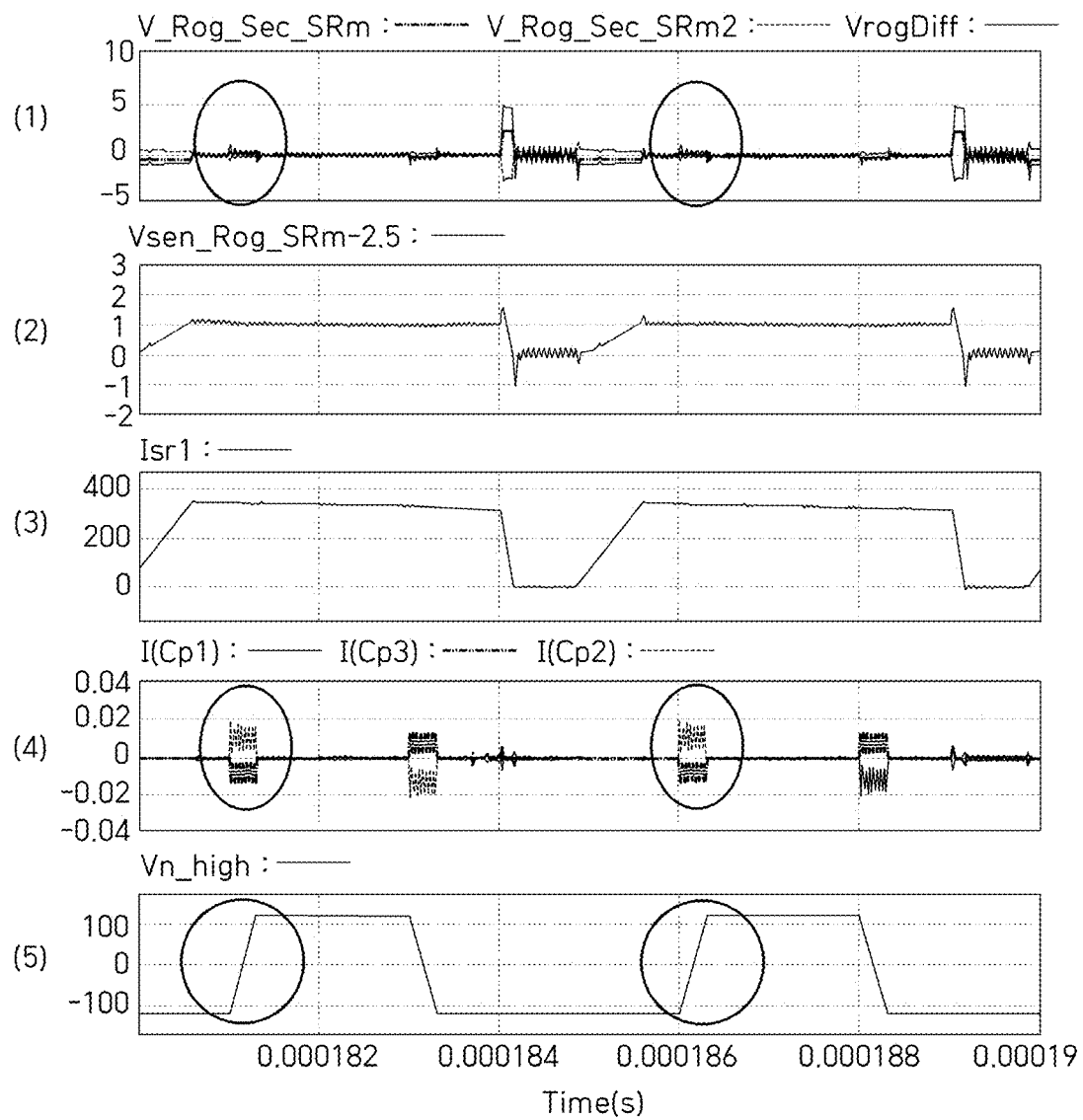

FIG. 6C shows simulation results of a case in which the pulse noise is introduced into the neutral point of the Rogowski sensor of the present invention. It can be seen that the magnitude of the distortion applied to the coil output signal was reduced to 0.2V, and the noise voltages induced in the output terminals of each coil were offset when input to the integrator so that the noise disappeared from the integrator output. Here, (1) the coil output voltage V_Rog_Sec_SRm is the output of a coil 1, V_rog_Sec_SRm2 is the output of a coil 2, and VrogDiff is a difference between the coils 1 and 2 (an integrator input voltage), (2) the integrator output voltage is Vsen_Rog_SRm-2.5, (3) the actual switching current is Isr1, (4) the Cp*dv/dt Noise current I(Cp1) is the noise current flowing into the coil 1, I(Cp2) is the sum of the noise flowing into the coils 1 and 2, I(Cp3) is the noise current flowing into the coil 2, and (5) the switching voltage noise is Vn_high.

In accordance with the present invention, the following effects can be obtained.

1. The printed circuit board (PCB) can be formed of four layers as in the related art, and thus there is no cost increase.
2. Total parasitic coupling capacitance can be reduced by ¼ when compared to the related art, and accordingly, the influence of Cp*dv/dt noise can be reduced.
3. Winding capacitance on a path through which a noise current $$C\frac{dv}{dt}$$

is introduced and flows is reduced by ½, and thus the noise influence can be reduced.

4. When compared to the related art, self inductance $L_s$ and winding capacitance $C_s$ of a coil can be reduced by ½, and thus a bandwidth of a sensor can be increased two-fold While the present invention have been described in detail with reference to exemplary embodiments, those skilled in the art can understand that the present invention can be implemented in other specific forms different from the content described herein without departing from the technical spirit or the essential characteristics of the present invention. It should be understood that the above-described embodiments are not restrictive but illustrative in all aspects. In addition, the scope of the present invention is defined by the appended claims rather than the detailed description, and it should be construed that all alterations or modifications derived from the meaning and scope of the appended claims and the equivalents thereof fall within the technical scope of the present invention.

What is claimed is:

1. A Rogowski sensor for detecting a switching current passing through a bus bar into which a switching element is inserted, the Rogowski sensor comprising:

a first coil which detects a first portion of the switching current passing through the bus bar and includes a first end and a second end; and a second coil, as a coil separated from the first coil, which detects a second portion of the switching current passing through the bus bar and includes a first end and a second end, wherein the second end of the first coil is connected to the second end of the second coil to form a neutral point.

2. The Rogowski sensor of claim 1, wherein the first coil and the second coil are configured such that dv/dt noise is introduced into the first end of the first coil and exits through the first end of the second coil by passing through the neutral point.

3. The Rogowski sensor of claim 1, wherein the first coil and the second coil are configured such that dv/dt noise is introduced into the neutral point and branches off to flow to a first terminal of the first coil and a first terminal of the second coil.

4. The Rogowski sensor of claim 1, further comprising:
a first printed circuit board (PCB) having a first four-layer structure including layers of GND1, VCC1, VCC2, and GND2 so that a first conductor pattern vertically passes through each layer, wherein the first coil is disposed inside the first PCB, and the first end and the second end of the first coil are exposed to an outside of the first PCB; and
a second PCB having a second four-layer structure including layers of GND1, VCC1, VCC2, and GND2 so that a second conductor pattern vertically passes through each layer, wherein the second coil is disposed inside the second PCB, and the first end and the second end of the second coil are exposed to an outside of the second PCB.

5. The Rogowski sensor of claim 4, wherein the first PCB and the second PCB are located to face each other to interpose the bus bar therebetween.

6. The Rogowski sensor of claim 1, further comprising:
a printed circuit board (PCB) having a four-layer structure including layers of GND1, VCC1, VCC2, and GND2 so that a first conductor pattern vertically passes through each layer,
wherein:
the first coil is disposed inside the PCB,
the first end and the second end of the first coil are exposed to an outside of the PCB,
the second coil is disposed inside the PCB so that a second conductor pattern separated from the first conductor pattern vertically passes through each layer, and
the first end and the second end of the second coil are exposed to the outside of the PCB.

7. A method of manufacturing a Rogowski sensor including a first coil which detects a first portion of a switching current passing through a bus bar and includes a first end and a second end, and a second coil, as a coil separated from the first coil, which detects a second portion of the switching current passing through the bus bar and includes a first end and a second end, the method comprising:
manufacturing a printed circuit board (PCB) to be located around the bus bar into which a switching element is inserted, wherein the PCB is manufactured so that the switching element is located around the bus bar, and the PCB has a four-layer structure including layers of GND1, VCC1, VCC2, and GND2;

arranging the first coil inside the PCB so that a first conductor pattern vertically passes through each layer and exposing the first end and the second end of the first coil to an outside of the PCB;

arranging the second coil inside the PCB so that a second conductor pattern separated from the first conductor pattern vertically passes through each layer and exposing the first end and the second end of the second coil to the outside of the PCB; and connecting the second end of the first coil to the second end of the second coil to form a neutral point.

8. The method of claim 7, wherein the manufacturing of the PCB includes manufacturing a first PCB in which the first coil is disposed and a second PCB which is separated from the first PCB and in which the second coil is disposed.

9. The method of claim 7, wherein the first coil and the second coil are configured such that dv/dt noise is introduced into the first end of the first coil and exits through the first end of the second coil by passing through the neutral point.

10. The method of claim 7, wherein the first coil and the second coil are configured such that dv/dt noise is introduced into the neutral point and branches to flow to a first terminal of the first coil and a first terminal of the second coil.

11. A circuit for processing an output signal of a Rogowski sensor including a first coil which detects a first portion of a switching current passing through a bus bar and includes a first end and a second end, and a second coil, as a coil separated from the first coil, which detects a second portion of the switching current passing through the bus bar and includes a first end and a second end, wherein the second end of the first coil is connected to the second end of the second coil to form a neutral point, the circuit comprising:
a first damping resistor connected to the first end and the second end of the first coil;
a second damping resistor connected to the first end and the second end of the second coil;
a first input resistor;
a second input resistor; and
an integrator including a negative (−) input to which the first end of the first coil is connected through the first input resistor and a positive (+) input to which the first end of the second coil is connected through the second input resistor.

12. The circuit of claim 11, wherein:
the integrator is an operational amplifier (OP-amp);
when supply power includes two types of power, a connection point of the first end of the second coil and the first input resistor is connected to a ground (GND); and
when the supply power is a single power, a reference voltage of ½ of a supply voltage is generated to be applied to the positive (+) input of the integrator.

13. The circuit of claim 11, wherein:
the integrator is an operational amplifier (Op-amp); and
when supply power includes two types of power, a virtual ground point is disposed between the two types of power using a resistor voltage divider, and the virtual ground point is connected to the neutral point to form a reference potential on a path of dv/dt noise.

\* \* \* \* \*